United States Patent
Omuro et al.

(10) Patent No.: US 11,604,232 B2
(45) Date of Patent: Mar. 14, 2023

(54) CONTROL DEVICE FOR MAGNETIC FIELD GENERATOR, TEST APPARATUS, AND MAGNETIC FIELD CONTROL METHOD

(71) Applicant: ADVANTEST Corporation, Tokyo (JP)

(72) Inventors: Toshiyuki Omuro, Tokyo (JP); Takashi Kimura, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 0 days.

(21) Appl. No.: 17/643,045

(22) Filed: Dec. 7, 2021

(65) Prior Publication Data

US 2022/0260649 A1 Aug. 18, 2022

(30) Foreign Application Priority Data

Feb. 12, 2021 (JP) .............................. JP2021-021090

(51) Int. Cl.
*G01R 33/00* (2006.01)

(52) U.S. Cl.
CPC .................................. *G01R 33/0017* (2013.01)

(58) Field of Classification Search
CPC combination set(s) only.
See application file for complete search history.

(56) References Cited

U.S. PATENT DOCUMENTS

| | | | | |
|---|---|---|---|---|
| 2005/0033500 A1* | 2/2005 | Moss | ................... | G05B 13/024 701/100 |
| 2011/0050154 A1* | 3/2011 | Farr | ....................... | H02H 3/006 361/30 |
| 2012/0326824 A1* | 12/2012 | Harris | .................. | G01D 5/2291 336/130 |
| 2013/0093412 A1* | 4/2013 | Anelli | .................... | G01R 33/07 324/202 |
| 2018/0321333 A1* | 11/2018 | Cochrane | ........... | G01R 33/0206 |

FOREIGN PATENT DOCUMENTS

| | | |
|---|---|---|
| JP | 2008-044305 A | 2/2008 |
| JP | 2011-113111 A | 6/2011 |

* cited by examiner

*Primary Examiner* — Alvaro E Fortich
(74) *Attorney, Agent, or Firm* — Osha Bergman Watanabe & Burton LLP (57) ABSTRACT

A control device controls a magnetic field generated by a magnetic field generator, and includes a magnetic field controller that controls the magnetic field generator based on a detected value by a magnetic field sensor. The magnetic field controller receives a command value generated by the magnetic field generator, and the detected value. The magnetic field controller generates an error signal based on an error between the command value and the detected value and outputs to the magnetic field generator a control signal amplified by a control gain against the error. The control gain includes: a first gain that becomes smaller as a frequency of the error signal gets higher; and a second gain that gets larger as an amplitude of the error signal gets larger.

5 Claims, 5 Drawing Sheets

CONTROL DEVICE FOR MAGNETIC FIELD GENERATOR, TEST APPARATUS, AND MAGNETIC FIELD CONTROL METHOD

CROSS-REFERENCE TO RELATED APPLICATIONS

The present application claims priority from Japanese Patent Application No. 2021-021090 filed on Feb. 12, 2021, the contents of which are incorporated herein by reference in their entirety.

BACKGROUND

Technical Field

The present invention is related to a control device for a magnetic field generator, a test apparatus, and a magnetic field control method.

DESCRIPTION OF RELATED ART

A PID controller that automatically sets PID parameters is known (for example, refer to Patent Document 1). In the PID controller, the auto-tuning section gradually increases the proportional gain Kp of the PID controller while the PID controller is in the P-control state and the target value input is kept constant. As Kp is increased, oscillations are generated in the deviation. The FFT analyzer analyzes the deviation and detects the natural oscillation frequency included in the deviation from the peak frequency. The filter removes noise components with frequencies higher than the natural oscillation frequency and outputs them to the RMS processing unit. The RMS processing unit calculates an effective value of each cycle of the oscillation of the deviation. The RMS processing unit sends a trigger signal to the auto-tuning unit to lower the value of Kp in the PID control unit when detecting that the value is increasing for multiple consecutive cycles. When the auto-tuning section receives the trigger signal, the PID parameters are determined from the proportional gain Kpc and the period Tc of the natural vibration at that time.

PATENT DOCUMENT

[Patent Document 1] Japanese Patent Application Publication 2008-044305

In the PID controller described in Patent Document 1, the response characteristics of the control system cannot be dynamically optimized when the range of speed demand of feedback control is wide.

SUMMARY

One or more embodiments of the present invention provide a control device for a magnetic field generator, a test apparatus, and a magnetic field control method in which the response characteristics of the control system are optimized.

[1] A control device according to one or more embodiments of the present invention comprises: a magnetic field control circuit (i.e., a magnetic field controller) that controls the magnetic field generator based on a detected value of a magnetic field sensor for detecting the magnetic field, wherein a command value of the magnetic field to be generated by the magnetic field generator is input to the magnetic field control circuit, the detected value of a magnetic field sensor is fed back and input to the magnetic field control circuit, the magnetic field control circuit generates an error signal in accordance with an error between the command value and the detected value and outputs a control signal amplified by a control gain against the error to the magnetic field generator, the control gain includes a first gain and a second gain, the first gain has a characteristic that the higher a frequency of the error signal, the smaller the gain, and the second gain has a characteristic that the larger amplitude of the error signal, the larger the gain.

[2] In the above-mentioned embodiments, the second gain may be set in accordance with command value response required for variation in the command value, output value response required for variation in the output of the magnetic field generator, and a detected value response required for variation in the detection value of the magnetic sensor.

[3] In the above-mentioned embodiments, the second gain may have a characteristic that the gain increases continuously with increasing the amplitude.

[4] A test apparatus according to one or more embodiments of the present invention comprises: a magnetic field generator that includes a coil and a core, and outputs a magnetic field to the electronic component under test; a magnetic field sensor that detects the magnetic field; and a magnetic field control circuit that controls the magnetic field generator based on a detected value of a magnetic field sensor for detecting the magnetic field; wherein a command value of the magnetic field to be generated by the magnetic field generator is input to the magnetic field control circuit, the detected value of a magnetic field sensor is fed back and input to the magnetic field control circuit, the magnetic field control circuit generates an error signal in accordance with an error between the command value and the detected value and outputs a control signal amplified by a control gain against the error to the magnetic field generator, the control gain includes a first gain and a second gain, the first gain has a characteristic that the higher a frequency of the error signal, the smaller the gain, and the second gain has a characteristic that the larger amplitude of the error signal, the larger the gain.

[5] A magnetic field control method according to one or more embodiments of the present invention comprises: a step of obtaining, by a feedback control, a detected value of a magnetic field sensor for detecting the magnetic field; a step of obtaining a command value of the magnetic field generated by a magnetic field generator; a step of generating an error signal in accordance with an error between the command value and the detected value; and a step of outputting a control signal amplified by a control gain against the error to the magnetic field generator, wherein the control gain includes a first gain and a second gain, the first gain has a characteristic that the higher a frequency of the error signal, the smaller the gain, and the second gain has a characteristic that the larger amplitude of the error signal, the larger the gain.

According to one or more embodiments of the present invention, the response characteristics of the control system can be optimized because the optimal control gain is set over a wide speed range for the speed demand of the feedback control by being sensitive to both the amplitude and frequency components of the control error.

DETAILED DESCRIPTION

Figure 1:
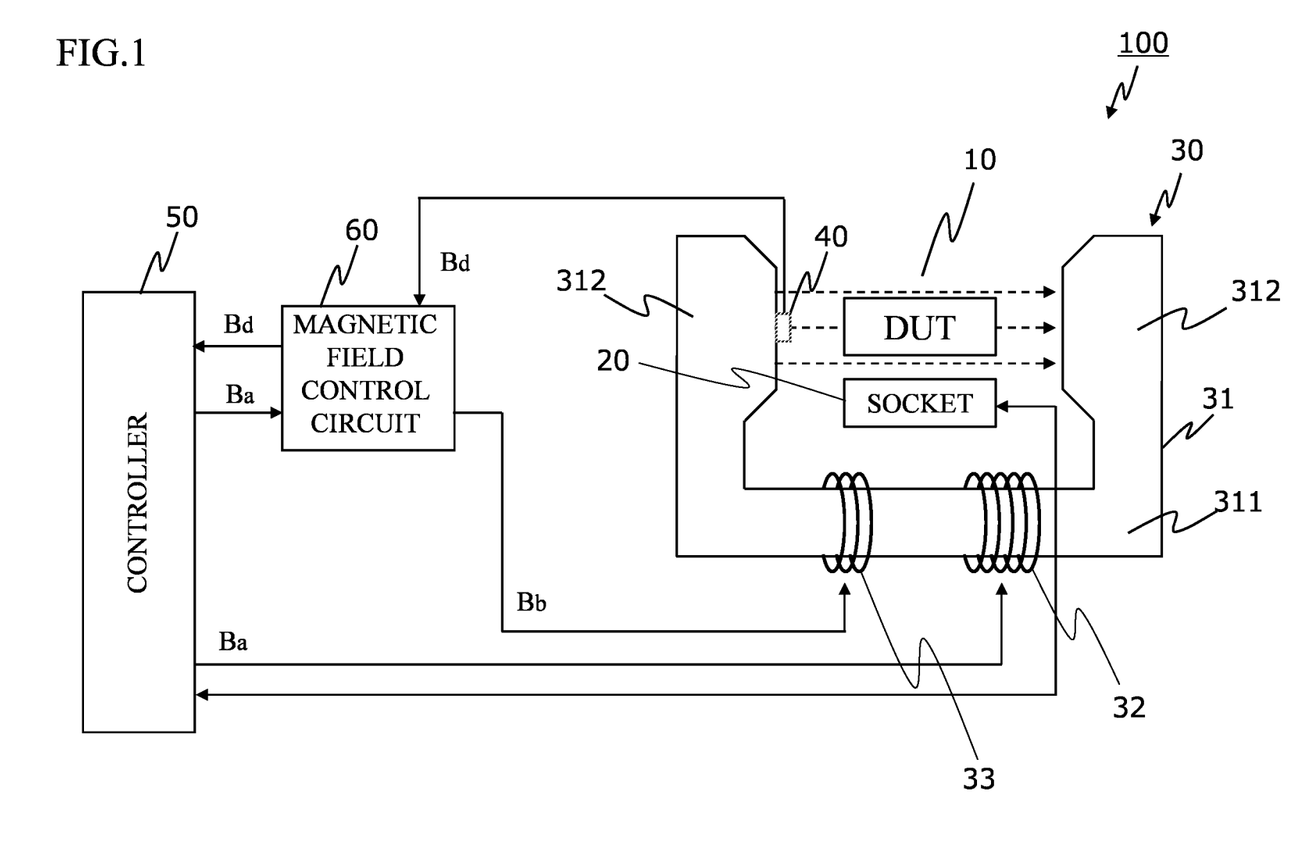
FIG. 1 is a block diagram of the test apparatus.

Hereinafter, embodiments of the present invention will be described with reference to the drawings. FIG. 1 is a block diagram of the test apparatus.

The test apparatus shown in FIG. 1 applies a magnetic field to the electronic component under test (DUT) 10 and tests (inspects) whether the DUT operates properly in this state. The DUT 10 is an object to be tested by the test apparatus according to one or more embodiments, for example, a sensor such as a current sensor or a magnetic sensor.

As shown in FIG. 1, a test apparatus 100 includes a socket 20, a magnetic field generator 30, a magnetic field sensor 40, a controller 50, and a magnetic field control circuit (i.e., a magnetic field controller) 60. The socket 20 contacts and electrically connects with the DUT 10 while holding the DUT 10. A pin is provided on the top surface of the socket 20 for contacting the DUT 10. The socket 20 has signal lines electrically connected to the pins. The socket 20 is connected to the controller 50 via a cable not shown in the drawing. Electrical signals from the controller 50 are sent to the DUT 10 via the socket 20 with the DUT 10 connected to the socket 20, and the DUT 10 is tested based on the signals output from the DUT 10.

The magnetic field generator 30 is an electromagnet and has a core 31, a main coil 32, and a correction coil 33. The core 31 is a member that strengthens the magnetic flux generated by the main coil 32 and the correction coil 33, and passes the closed loop (magnetic circuit) formed by the magnetic flux through the DUT 10.

The core 31 has a main body 311 around which the main coil 32 and the correction coil 33 are wound, and an extension 312 extending from the main body 311 toward the DUT 10. The main body 311 and the extension 312 are integrated. The main body 311 is formed in the shape of a column. The extension 312 extends from both ends of the main body 311 so as to approach the sides of the DUT 10. A magnetic field is generated from the end of one extension 312 toward the end of the other extension 312, and the DUT 10 is placed in a magnetic circuit.

The main coil 32 is wound around the main body 311. When a current flows through the main coil 32 under the control of the controller 50, a magnetic flux is generated, and the magnetic flux passes in a closed loop containing the core 31 and the DUT 10.

The correction coil 33 is wound on the main body 311. The number of turns of the correction coil 33 is less than the number of turns of the main coil 32. The correction coil 33 is a coil for correcting the magnetic field generated by the magnetic field generator 30. When current flows to the correction coil 33 while current is flowing in the main coil 32 and a magnetic field is being generated, the magnetic field generated by the correction coil 33 is added to the magnetic field generated by the main coil 32. The magnetic field generated by the correction coil 33 is smaller than the magnetic field generated by the main coil 32. By controlling the current flowing in the main coil 32, the magnetic field generated by the magnetic field generator 30 is adjusted to a larger value, and by controlling the current flowing in the correction coil 33, the magnetic field generated by the magnetic field generator 30 is adjusted to a smaller value.

The magnetic field sensor 40 detects the magnetic field (magnetic flux) generated by the magnetic field generator 30. The magnetic field sensor 40 is located in the magnetic circuit. The detected value of the magnetic field sensor 40 is output to the magnetic field control circuit 60.

The controller 50 controls the current flowing in the main coil 32 and the correction coil 33. The controller 50 has an arithmetic unit such as a CPU or MPU, and memory such as ROM and RAM. The controller 50 sets the magnetic field to be applied to the DUT based on an external command or operation by the user, and outputs the magnetic field command value (Ba) to the main coil 32 and the magnetic field control circuit 60 for generating the set magnetic field. The current to generate the magnetic field command value (Ba) flows to the main coil 32. The controller 50 obtains the detected value (Bd) of the magnetic field sensor 40 via the magnetic field control circuit 60. When the set magnetic field is to be changed, the controller 50 calculates the magnetic field command value (Ba) so that the detected value becomes the set magnetic field after the change.

The magnetic field control circuit 60 is a control circuit that comprises, for example, a microcontroller, and controls the magnetic field generator 30 based on the detected values of the magnetic field sensor 40. The device including the magnetic field control circuit 60 corresponds to the control device of one or more embodiments of the present invention. The detected value (Bd) of the magnetic field sensor 40 is fed back and input to the magnetic field control circuit 60. The magnetic field command value (Ba) is input to the magnetic field control circuit 60 from the controller 50. The magnetic field control circuit 60 detects the error between the magnetic field command value (Ba) and the detected value (Bd) by calculating the difference between the magnetic field command value (Ba) and the detected value (Bd). The magnetic field control circuit 60 generates a signal according to the detected error. Specifically, the magnetic field control circuit 60 generates a signal that includes the magnetic field command value (Bb) to be generated by the correction coil 33 so that the detected value (Bd) matches the magnetic field command value. For example, if the detected value is lower than the set magnetic field (set magnetic flux), the command value (Bb) of the magnetic field to be generated by the correction coil 33 is calculated so that the magnetic field of the magnetic field generator 30 is increased, and the calculated magnetic field command value (Bb) is output to the correction coil 33. The controller 50 and the magnetic field control circuit 60 control the main coil 32 and the correction coil 33 by current control or voltage control.

Figure 2:
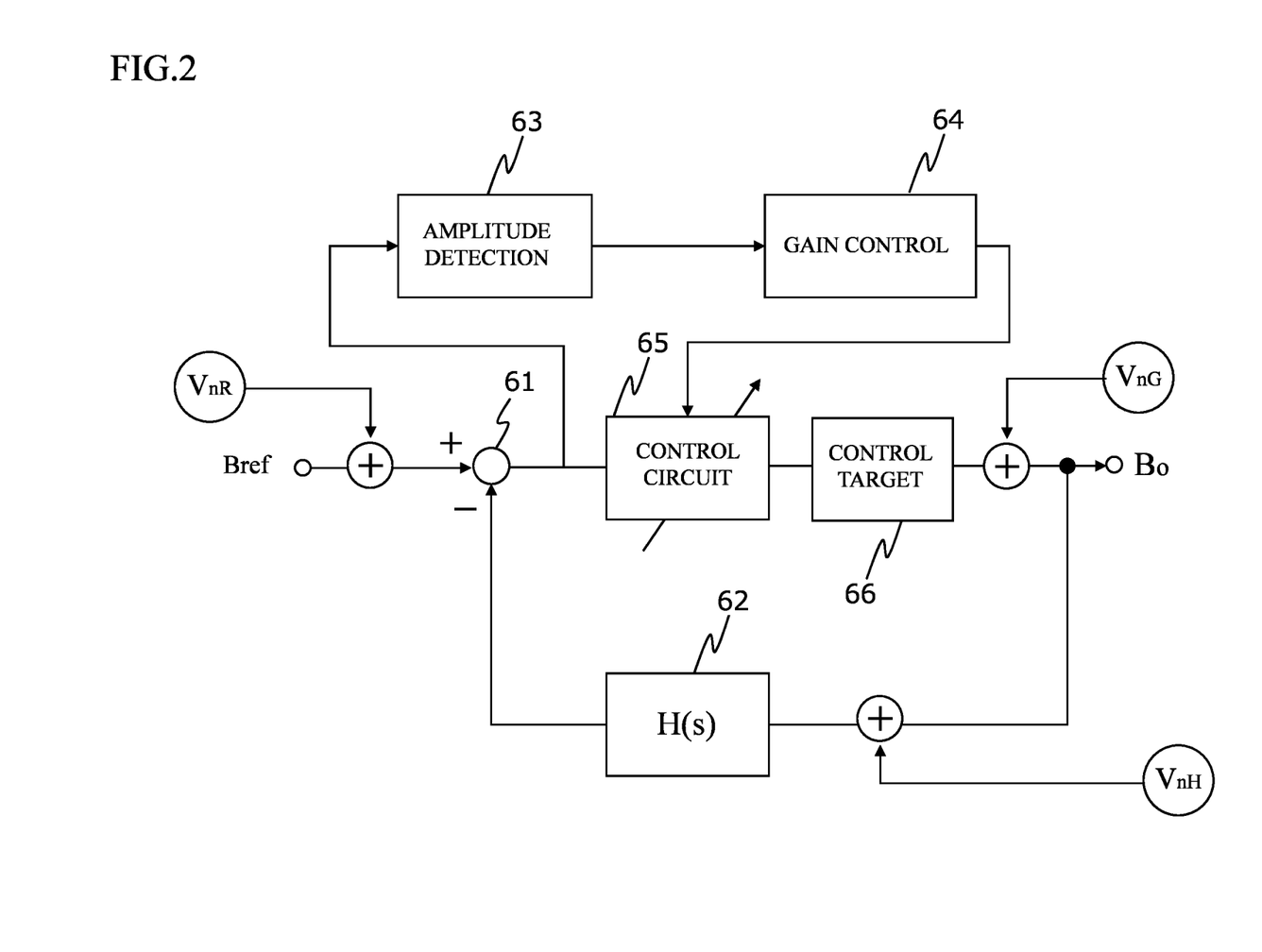
FIG. 2 is a block diagram of the test apparatus in FIG. 1.

Next, the system control in the test apparatus 100 is described with reference to FIG. 2. The system control in the test apparatus 100 includes feed-forward and feedback elements. The system control has a calculation unit 61, control elements 62 to 65, and a control target 66. The signal containing the magnetic field command value (Ba) that is input from the controller 50 to the magnetic field control circuit 60 corresponds to the reference input signal (Bref) of the system control. The arithmetic processing by the calculation unit 61 and the control process by the control elements 63 to 65, which are described in detail below, are executed in the magnetic field control circuit 60. The control process including control element 62 is also executed by returning the detected value of the magnetic field sensor to the magnetic field control circuit 60.

The calculation unit 61 calculates the difference (ΔV) between the magnetic field command value (Ba) contained in the reference input signal and the detected value. The detected value is the value converted by the control element 62. The difference (ΔV) corresponds to the error between the command value and the detected value. Then, the calculation unit 61 outputs the error signal including the difference (ΔV) to the control elements 63 and 65. In this way, the calculation unit 61 generates an error signal according to the error between the command value and the detected value, and outputs the error signal to the control elements 63 and 65.

The control element 62 is the element that converts the controlled quantity into a signal that can be compared to a reference input signal, and corresponds to the magnetic field sensor 40. The controlled quantity is the magnetic field generated by the magnetic field generator 30. The control element 62 is a feedback element and is represented by the transfer function (H(s)).

Figure 3:
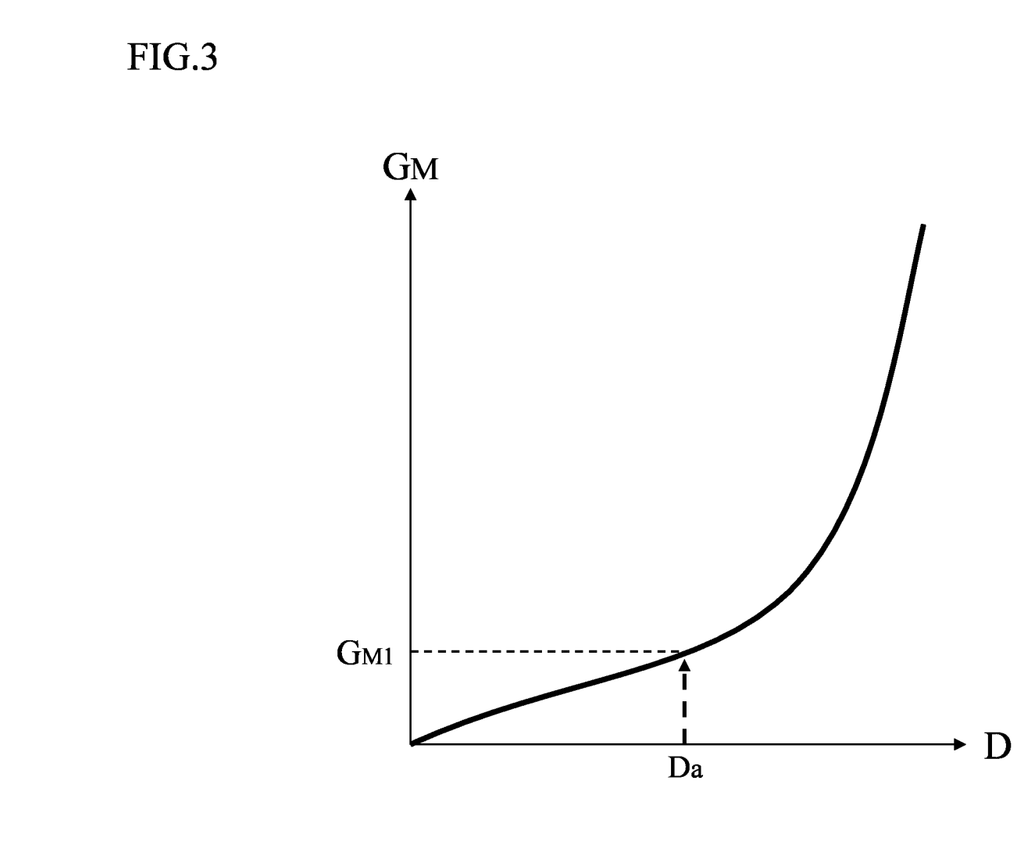
FIG. 3 is a graph showing the characteristics of the gain against to the amplitude of the error signal.

The control element 63 detects the amplitude component of the error signal (amplitude detection). The amplitude component of the error signal is a transient control error and is represented by the peak, integral, average, or RMS value of the error signal per predetermined time. The control element 64 determines the gain ($G_M$) to change the response characteristics of the control system against to the transient control error (gain control). The control element 64 stores predetermined gain characteristics in a map. The characteristics of the gain, which is set by the control element 64, are represented by the graph shown in FIG. 3. In FIG. 3, the horizontal axis indicates the amplitude of the error signal (D), and the vertical axis indicates the magnitude of the gain ($G_M$). The gain ($G_M$) of the control element 64 has a characteristic that the larger the amplitude (D) of the error signal, the larger the gain ($G_M$). The gain ($G_M$) has the characteristic that the gain increases continuously with increasing the amplitude (D) of the error signal. The control element 64 then sets a small gain ($G_M$) when the amplitude of the error signal is small, and sets a large gain ($G_M$) when the amplitude of the error signal is large. The gain characteristic shown in FIG. 3 is only one example. The gain ($G_M$) characteristic may be a characteristic that increases proportionally to the amplitude (D) of the error signal. The gain ($G_M$) may also have a characteristic such that the larger the amplitude (D) of the error signal, the larger the gain (GM) in some range of amplitudes. For example, if the amplitude (D) of the error signal is less than or equal to a predetermined low amplitude side threshold, the magnitude of the gain ($G_M$) is the first predetermined value, and if the amplitude (D) of the error signal is greater than the low amplitude side threshold and less than the predetermined high amplitude side threshold, the larger the amplitude (D) of the error signal, the larger the gain ($G_M$). When the amplitude (D) of the error signal is greater than the threshold on the high amplitude side, the magnitude of the gain ($G_M$) may be characterized as the second predetermined value (>the first predetermined value). The gain (GM) may also have a characteristic such that the magnitude of the gain remains at a constant value in a part of the amplitude range. The control element 64 outputs the set gain (GM) to the control element 65. The control element 63 and the control element 64 correspond to the feed-forward elements.

Figure 4:
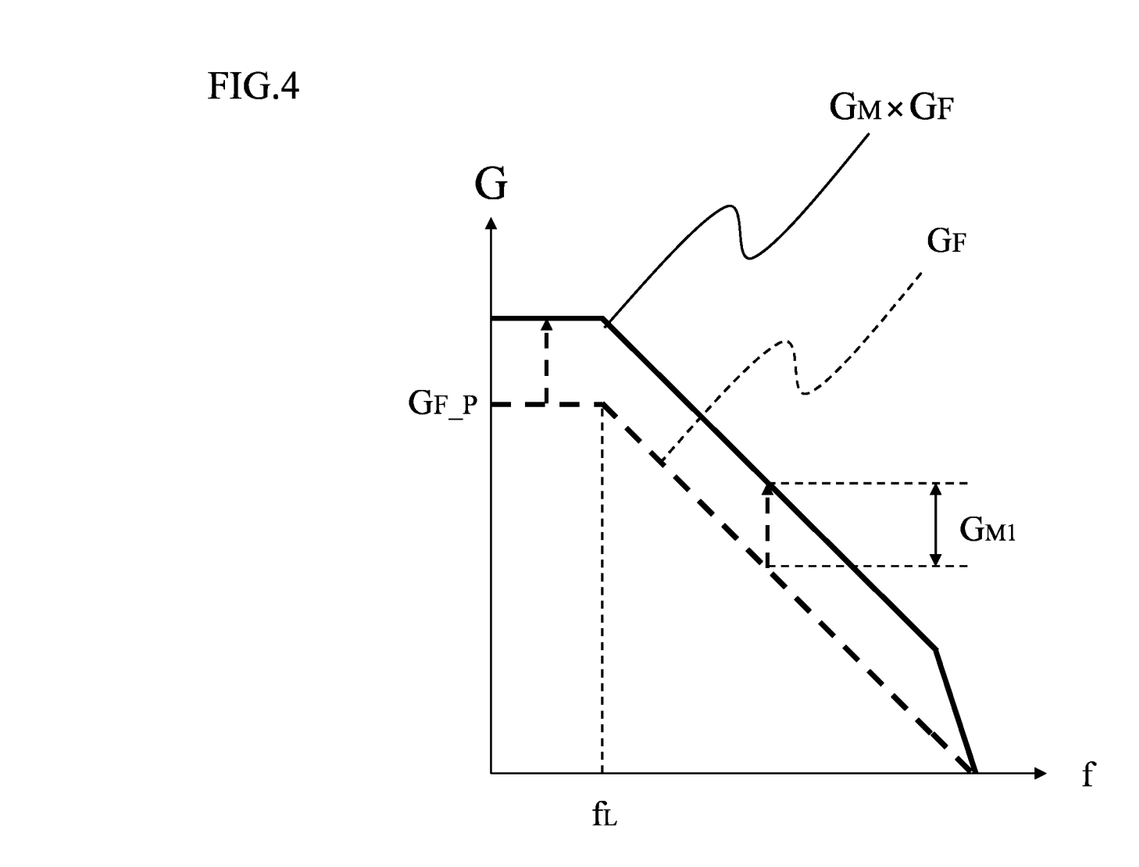
FIG. 4 shows the gain characteristics of the control gain set in the magnetic field control circuit.

The control element 65 generates a control signal by increasing the error with the control gain (G(s)), and outputs the generated control signal to the control target 66. The control element 65 generates the control signal in the following manner. The control element 65 performs a filtering process on the error signal to identify the frequency components included in the error signal that have unique frequency response characteristics. The control element 65 determines a gain ($G_F$) for the identified frequency component. The gain ($G_F$) is a gain for changing the response characteristics of the control system against to a stationary control error. The control element 65 stores the predetermined gain characteristics in a map. The characteristics of the gain ($G_F$) set by the control element 65 are represented by the graph shown in FIG. 4. In FIG. 4, the horizontal axis represents the frequency (f) of the error signal. The vertical axis represents the magnitude of the gain. The dotted line graph in FIG. 4 shows the characteristics of the gain ($G_F$). The gain ($G_F$) has a characteristic that the higher the frequency of the error signal, the smaller the magnitude of the gain. In the example of FIG. 4, when the frequency of the error signal is below the low frequency side threshold ($f_L$), the magnitude of gain ($G_F$) becomes the maximum gain ($G_{F\_P}$). When the frequency of the error signal is higher than the low frequency side threshold ($f_L$) and lower than the high frequency side threshold (GO, the magnitude of gain ($G_F$) becomes proportional to the increase in frequency When the error signal frequency is higher than the low frequency side threshold ($f_L$) and lower than the high frequency side threshold, the magnitude of the gain ($G_F$) becomes smaller in proportion to the increase in frequency.

The gain ($G_F$) may have a characteristic that the magnitude of the gain ($G_F$) decreases as the frequency increases in some range of frequencies, and does not necessarily have to be a linear function characteristic as shown in FIG. 4. The gain ($G_F$) may have a characteristic such that the magnitude of the gain remains at a constant value in a part of the frequency range.

The control element 65 determines the control gain ($G_M \times G_F$) by adding the gain ($G_M$) determined by the control element 64 to the gain ($G_F$) determined by referring to the map. In other words, the control gain ($G_M \times G_F$) includes the gain ($G_M$) and the gain ($G_F$). The solid line graph in FIG. 4 shows the characteristics of the control gain ($G_M \times G_F$). For example, when the amplitude of the error signal is Da, the control element 64 determines the magnitude of the gain ($G_M$) to $G_{M1}$. The control element 65 adds the gain ($G_{M1}$) for the oscillation component to the gain ($G_F$) for the frequency component of the error signal. In FIG. 4, when the vertical axis is displayed in logarithmic form, the control gain is the gain characteristic shifted by the gain ($G_{M1}$) so that the gain becomes larger in relation to the gain ($G_F$). As a result, the control gain becomes larger by a gain shift of the gain ($G_{M1}$). For example, in the example of FIGS. 3 and 4, if the amplitude of the error signal is larger than Da, the gain ($G_M$) is larger than $G_{M1}$, and therefore the amount of shift in the control gains also be larger.

The control element 65 amplifies the error signal with the control gain ($G_M \times G_F$). The control element 65 converts the command value (command value after amplification by the control gain) contained in the amplified error signal into a control signal that can be controlled by the control target 66 and outputs the converted signal to the control target 66. The control target 66, which corresponds to the magnetic field generator 30, generates a magnetic field based on the control signal.

Next, the variation factors (noise factors) that affect the system control and the required responsiveness to different variation will be explained with reference to FIG. 2. In FIG. 2, $V_{nG}$, $V_{nH}$, and $V_{nR}$ represent variation (noise) added to the system control, and $V_{nG}$ represents variation in the control system caused by factors external to the test apparatus 100, such as vibrations applied to the test apparatus 100 and magnetic changes in the core. In the following explanation, the variation factor for which a high response speed is required for variation suppression is $V_{nG}$ (high speed), and the variation factor for which a low response speed is required for variation suppression is $V_{nR}$ (low speed). The variation factor that requires a response speed lower than that of the variation factor ($V_{nG}$) and higher than that of the variation factor ($V_{nR}$) in order to suppress variation is designated as $V_{nH}$. However, the size of the response speed required to suppress $V_{nG}$, $V_{nH}$, and $V_{nR}$ may vary as required depending on the system control setting conditions, operating conditions, or environment. In other words, the order of the response speed to suppress the variation factors ($V_{nG}$, $V_{nH}$, $V_{nR}$) is not limited to the order of "high speed, medium speed, low speed" as shown in the following example, but may be "high speed, low speed, medium speed", "medium speed, high speed, low speed", or "low speed, medium speed, high speed", etc. In this form of system control, the feed-forward gain ($G_M$) is increased to speed up the feedback speed of loop control by increasing the control gain and suppressing variation. On the other hand, if the control gain is small, it takes a long time to return the output value of the control target 66 to the command value of the reference input signal when the output value of the control target 66 fluctuates due to fluctuations caused by $V_{nG}$. In the system control in one or more embodiments, the variation caused by $V_{nG}$ is detected from the amplitude component of the error signal, and the gain is increased by the gain control of the control element 64. Furthermore, during testing, when the magnetic field setting is changed by an external command, the generated magnetic field of the magnetic field generator 30 can be made to follow the change in the magnetic field setting at a high speed, and the speed of the magnetic field setting can also be improved.

$V_{nR}$ represents the noise contained in the reference input signal, and represents variation caused by internal noise of the arithmetic unit that calculates the command value (reference value), etc. $V_{nR}$ requires a low response speed (low speed) compared to other variations factors ($V_{nH}$ and $V_{nG}$). When the command value fluctuates due to internal factors such as internal noise of the arithmetic unit, the command value fluctuates at a high speed. Therefore, when the feed-forward gain ($G_M$) is lowered, the control gain is lowered, and the feedback speed of the loop control is slowed down, the command value fluctuation will be absorbed. On the other hand, when the feedback speed of the loop control is fast, the gain setting will change in accordance with the variation of the command value, and the command of the control signal will not be stable. In other words, in one or more embodiments, when the command value of the error signal fluctuates due to internal factors, the control gain is set so that the fluctuation is absorbed.

$V_{nH}$ represents the noise included in the detected value of the magnetic field sensor 40, for example, the variation caused by the noise inside the sensor. $V_{nH}$ requires a lower response speed (medium speed) compared to other variation factors ($V_{nG}$). Therefore, as in the case of low speed, the system control of one or more embodiments absorbs the variation of the detected value of the magnetic field sensor 40 by lowering the gain (GM) of the feed-forward, lowering the control gain, and slowing down the feedback speed of the loop control.

Thus, the gain ($G_M$) set in this system control of one or more embodiments is set according to the command value response required for the command value of the reference value signal (low speed), the output value response required for the output variation of the magnetic field generator 30 (high speed), and the detection value response required for the variation of the detection value of the magnetic field sensor 40 (medium speed). This makes it possible to achieve both high-speed control to follow changes in the magnetic field setting at high speed and internal noise suppression to absorb variation in the command value/detected value caused by internal noise.

Figure 5A:
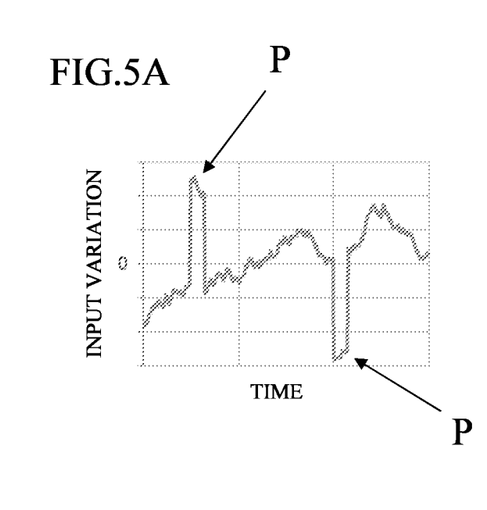
FIGS. 5A-5D are graphs illustrating the relationship between input variation and output variation in the test apparatus of FIG. 1.
Figure 5B:
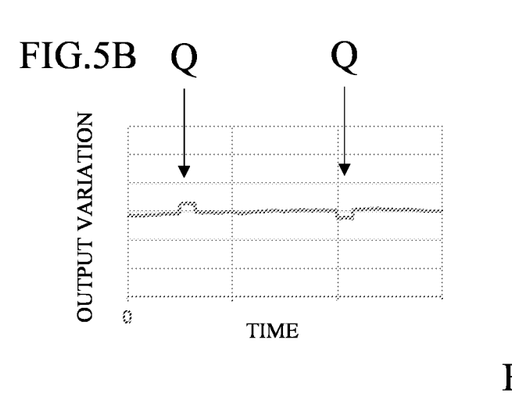

FIGS. 5A-5D illustrate the input and output variations to the system control in the test apparatus 100. FIG. 5A shows the input variation. The input variation shown in FIG. 5A includes noise from external factors and noise from internal factors. The external factor is represented by the arrow P. The effect of the noise of the external factor causes the command value contained in the reference signal to change in a pulsed manner. The input variation other than the arrow P is the noise of internal factors. The graph shown in FIG. 5B represents the output variation when only low-speed control is performed among high-speed and low-speed control. The high speed control represents the loop control with high response speed by increasing the control gain. In the system control in the test apparatus 100, the control that increases the feed-forward gain ($G_M$) corresponds to the high-speed control. The low-speed control represents the loop control with low response speed by lowering the control gain. In the system control in the test apparatus 100, the control that lowers the gain ($G_M$) of feedforward and/or the control under the loop characteristic of the gain ($G_F$) of feedback corresponds to the low-speed control. As shown in FIG. 5B, when only low-speed control is performed, the variation due to noise from internal factors is reduced, but the variation due to noise from external factors is not sufficiently suppressed (refereeing to the arrow Q).

Figure 5C:
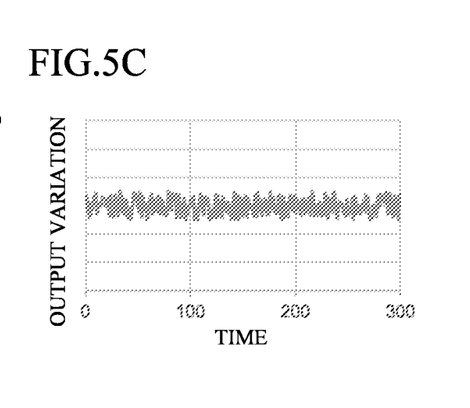

The graph shown in FIG. 5C shows the output variation when only high-speed control is performed among high-speed and low-speed control. When only high speed control is performed, the variation caused by noise from external factors becomes smaller, but the variation caused by noise from internal factors cannot be suppressed.

Figure 5D:
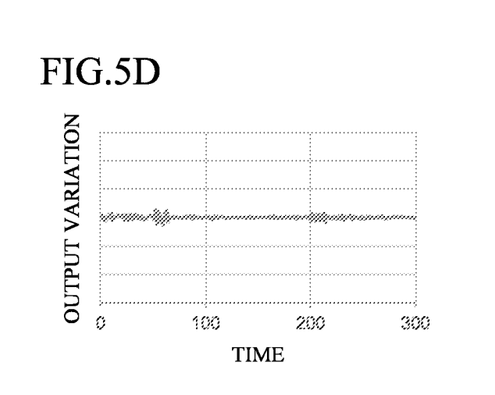

The graph shown in FIG. 5D shows the output variation of the system control in the test apparatus 100 when both high-speed and low-speed control are performed. When both high-speed control and low-speed control are performed, both the variation caused by internal noise and external noise can be suppressed.

As explained above, the control device for the magnetic field generator 30 of one or more embodiments includes the magnetic field control circuit 60 that controls the magnetic field generator 30 based on the detected value of the magnetic field sensor 40. The command value of the magnetic field to be generated by the magnetic field generator 30 is input to the magnetic field control circuit 60. The detected value of the magnetic field sensor 40 fed back and input to the magnetic field control circuit 60. The magnetic field control circuit 60 generates the error signal according to the error between the command value and the detected value, and outputs a control signal amplified by a control gain against the error to the magnetic field generator 30. The control gain includes the gain $G_F$, corresponding to "the first gain", which has the characteristic that the higher a frequency of the error signal, the smaller the gain, and the gain $G_M$, corresponding to "the second gain", which has the characteristic that the larger amplitude of the error signal, the larger the gain. This makes it possible to optimize the response characteristics of the control system by achieving both high-speed control to follow the magnetic field setting changes at high speed and internal noise suppression to absorb variation in the command value/detected value caused by internal noise.

In the control device for the magnetic field generator 30 of one or more embodiments, the gain ($G_M$) is set in accordance with the command value response required for the command value of the reference value signal, the output value response required for the variation in the output of the magnetic field generator 30, and the detected value response required for the variation in the detection value of the magnetic field sensor 40. This makes it possible to optimize the response characteristics of the control system by achieving both high-speed control to follow the magnetic field setting changes at high speed and internal noise suppression to absorb variation in the command value/detected value caused by internal noise.

In the control device for the magnetic field generator 30 of one or more embodiments, the gain ($G_M$) has the characteristic that the gain increases continuously with increasing the amplitude. For example, in a system control different from one or more embodiments, there is a control in which the gain is switched by a switch, but the gain characteristics in such a control cannot maintain the continuity of the output against input variation. However, the gain characteristics in such control cannot maintain continuity of the output in response to input variation. On the other hand, in one or more embodiments, the gain characteristics change smoothly, so the continuity of the output can be maintained in response to input variation.

The test apparatus of one or more embodiments includes the magnetic field generator 30 that includes the coil and a core, and outputs the magnetic field to the electronic component under test, and the magnetic field sensors 40 that detects the magnetic field that detects the magnetic field. This makes it possible to optimize the response characteristics of the control system by achieving both high-speed control to follow the magnetic field setting changes at high speed and internal noise suppression to absorb variation in the command value/detected value caused by internal noise.

The magnetic field control method of one or more embodiments includes: a step of obtaining, by a feedback control, the detected value of a magnetic field sensor 40; a step of obtaining a command value of the magnetic field generated by a magnetic field generator 30; a step of generating the error signal in accordance with the error between the command value and the detected value; and a step of outputting the control signal amplified by the control gain against the error. The control gain includes the gain $G_F$ which has the characteristic that the higher a frequency of the error signal, the smaller the gain, and the gain $G_M$ which has the characteristic that the larger amplitude of the error signal, the larger the gain. This makes it possible to optimize the response characteristics of the control system by achieving both high-speed control to follow the magnetic field setting changes at high speed and internal noise suppression to absorb variation in the command value/detected value caused by internal noise.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

EXPLANATIONS OF LETTERS OR NUMERALS

10 Electronic component under test (DUT)
20 Socket
30 Magnetic field generator
31 Core
32 Main coil
33 Correction coil
40 Magnetic field sensor
50 Controller
60 Magnetic field control circuit
100 Test apparatus

What is claimed is:

1. A control device that controls a magnetic field generated by a magnetic field generator, the control device comprising:
   a magnetic field controller that controls the magnetic field generator based on a detected value of the magnetic field by a magnetic field sensor,
   wherein the magnetic field controller receives:
      a command value of the magnetic field generated by the magnetic field generator, and
      the detected value by the magnetic field sensor that is fed back to the magnetic field controller,
   the magnetic field controller generates an error signal based on an error between the command value and the detected value and outputs to the magnetic field generator a control signal amplified by a control gain against the error signal,
   the control gain includes:
      a first gain that becomes smaller as a frequency of the error signal gets higher; and
      a second gain that gets larger as an amplitude of the error signal gets larger.

2. The control device according to claim 1, wherein the second gain is based on a command value response required for variation in the command value, an output value response required for variation in an output of the magnetic field generator, and a detected value response required for variation in the detection value of the magnetic sensor.

3. The control device according to claim 1, wherein the second gain increases continuously with the amplitude increasing.

4. A test apparatus that tests an electronic component under test, the test apparatus comprising:
   a magnetic field generator that comprises a coil and a core and outputs a magnetic field to the electronic component under test;
   a magnetic field sensor that detects the magnetic field; and
   a magnetic field controller that controls the magnetic field generator based on a detected value of the magnetic field by the magnetic field sensor;
   wherein the magnetic field controller receives:
      a command value of the magnetic field generated by the magnetic field generator, and
      the detected value by the magnetic field sensor that is fed back to the magnetic field controller,
   the magnetic field controller generates an error signal based on an error between the command value and the detected value and outputs to the magnetic field generator a control signal amplified by a control gain against the error signal,
   the control gain includes:
      a first gain that becomes smaller as a frequency of the error signal gets higher; and
      a second gain that gets larger as an amplitude of the error signal gets larger.

5. A method for controlling a magnetic field generated by a magnetic field generator, the method comprising:

obtaining, by a feedback control, a detected value of the magnetic field by a magnetic field sensor;

obtaining a command value of the magnetic field generated by the magnetic field generator;

generating an error signal based on an error between the command value and the detected value; and outputting to the magnetic field generator a control signal amplified by a control gain against the error signal, wherein the control gain includes:
- a first gain that becomes smaller as a frequency of the error signal gets higher; and
- a second gain that gets larger as an amplitude of the error signal gets larger.

* * * * *